(12) United States Patent
Zhang

(10) Patent No.: US 11,910,645 B2
(45) Date of Patent: Feb. 20, 2024

(54) DISPLAY PANEL AND DISPLAY DEVICE

(71) Applicant: KunShan Go-Visionox Opto-Electronics Co., Ltd, Jiangsu (CN)

(72) Inventor: Bing Zhang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 374 days.

(21) Appl. No.: 17/500,178

(22) Filed: Oct. 13, 2021

(65) Prior Publication Data

US 2022/0037423 A1    Feb. 3, 2022

Related U.S. Application Data

(63) Continuation of application No. PCT/CN2020/085221, filed on Apr. 16, 2020.

(30) Foreign Application Priority Data

Oct. 21, 2019   (CN) .......................... 201911000584.1

(51) Int. Cl.
   *H01L 21/00*    (2006.01)
   *H10K 59/121*   (2023.01)
   (Continued)

(52) U.S. Cl.
   CPC ......... *H10K 59/121* (2023.02); *H10K 59/122* (2023.02); *H10K 59/65* (2023.02)

(58) Field of Classification Search
   CPC ..... H10K 59/122; H10K 59/121; H10K 59/65
   See application file for complete search history.

(56) References Cited

U.S. PATENT DOCUMENTS

| 2006/0103940 A1 | 5/2006 | Lo et al. |
| 2017/0271413 A1 | 9/2017 | Liao et al. |

(Continued)

FOREIGN PATENT DOCUMENTS

| CN | 105789248 A | 7/2016 |
| CN | 107968105 A | 4/2018 |

(Continued)

OTHER PUBLICATIONS

The International search report for PCT Application No. PCT/CN2020/085221, dated Jul. 2, 2020, 7 pages.

(Continued)

*Primary Examiner* — Douglas M Menz
(74) *Attorney, Agent, or Firm* — Maier & Maier, PLLC

(57) ABSTRACT

A display panel and a display device. The display panel includes a first display region, a second display region and a boundary between the first display region and the second display region, a light transmittance of the second display region is greater than that of the first display region, the display panel includes a substrate and a pixel layer, the pixel layer includes a plurality of first sub-pixels arranged in a first arrangement in the first display region and a plurality of second sub-pixels arranged in a second arrangement in the second display region, the second arrangement is different from the first arrangement, a second light-emitting structure of each second sub-pixel and a first light-emitting structure of each first sub-pixel respectively adjacent to the boundary and having a same color are interconnected to form an interconnected light-emitting structure.

17 Claims, 5 Drawing Sheets

(51) Int. Cl.
  *H10K 59/65*   (2023.01)
  *H10K 59/122*  (2023.01)

(56) References Cited

U.S. PATENT DOCUMENTS

2021/0065625 A1* 3/2021 Wang ............... H10K 59/35
2021/0359031 A1* 11/2021 Zheng .............. H04M 1/02
2021/0376011 A1* 12/2021 Liu ................. H10K 59/353

FOREIGN PATENT DOCUMENTS

| CN | 108010936 A | 5/2018 |
| CN | 208271472 U | 12/2018 |
| CN | 109755282 A | 5/2019 |
| CN | 209401629 U | 9/2019 |
| CN | 110767702 A | 2/2020 |
| CN | 110783385 A | 2/2020 |

OTHER PUBLICATIONS

The First Office Action for Chinese Application No. 201911000584. 1, dated Jun. 19, 2020, 7 pages.
The Second Office Action for Chinese Application No. 201911000584. 1, dated Jul. 27, 2020, 4 pages.

* cited by examiner

DISPLAY PANEL AND DISPLAY DEVICE

CROSS REFERENCE TO RELATED DISCLOSURE

This application is a continuation of International Application No. PCT/CN2020/085221 filed on Apr. 16, 2020, which claims priority to Chinese Patent Application No. 201911000584.1, entitled "DISPLAY PANEL AND DISPLAY DEVICE" and filed on Oct. 21, 2019, both of which are hereby incorporated by reference in their entireties.

TECHNICAL FIELD

The present disclosure relates to a technical field of display, and particularly relates to a display panel and a display device.

BACKGROUND

High screen-to-body ratio is the latest development direction of smart electronic products. In order to increase the screen-to-body ratio, various sensors in the front of the electronic products need to be integrated under a display panel. At present, a fingerprint identifier, an earpiece and other means can be well integrated under the display panel, but the integration of a front camera of the electronic product is still a problem.

With respect to the integration of the front camera, the current solution is to dig a groove or punch a hole at a position of the display panel corresponding to the camera, but this will cause a problem that information cannot be displayed on the grooved or punched region of the display panel.

SUMMARY

The present disclosure provides a display panel and a display device, which can realize display on a region of the display panel where a photosensitive component is integrated.

In one aspect, an embodiment of the present disclosure provides a display panel including a first display region, a second display region and a boundary between the first display region and the second display region, a light transmittance of the second display region is greater than a light transmittance of the first display region, and the display panel includes a substrate and a pixel layer located on the substrate, wherein the pixel layer includes a plurality of first sub-pixels arranged in a first arrangement in the first display region and a plurality of second sub-pixels arranged in a second arrangement in the second display region, each of the first sub-pixels includes a first light-emitting structure, each of the second sub-pixels includes a second light-emitting structure, and the second arrangement of the second sub-pixels is different from the first arrangement of the first sub-pixels, and the second light-emitting structure of each of the second sub-pixels and the first light-emitting structure of each of the first sub-pixels respectively adjacent to the boundary and having a same color are interconnected to form an interconnected light-emitting structure.

According to the display panel of the embodiment of the present disclosure, the light transmittance of the second display region is greater than the light transmittance of the first display region, so the photosensitive component may be integrated under the second display region of the display panel, whereby the photosensitive component such as the camera may be integrated under a screen, and images can be displayed on the second display region, thereby increasing a display area of the display panel and realizing a full-screen design of the display device.

The second light-emitting structure of each of the second sub-pixels and the first light-emitting structure of each of the first sub-pixels respectively adjacent to the boundary and having a same color are interconnected to form an interconnected light-emitting structure, and each of the interconnected light-emitting structures may correspond to a vapor deposition opening of a mask, thereby realizing the simultaneous formation of the second light-emitting structure and the first light-emitting structure respectively adjacent to the boundary and having the same color, whereby a problem of mutual interference between the vapor deposition process of the second light-emitting structure and the vapor deposition process of the first light-emitting structure when the first light-emitting structure and the second light-emitting structure respectively correspond to different vapor deposition openings is solved. In addition, by forming the interconnected light-emitting structure, a too wide non-luminous region between the second sub-pixel and the first sub-pixel which are adjacent to the boundary is avoided, thereby reducing a size of a rib of a pixel opening and eliminating at least one dark line easily appearing at the boundary when the display panel is displaying.

In another aspect, an embodiment of the present disclosure provides a display device including the display panel of any one of the foregoing embodiments.

According to the display device of an embodiment of the present disclosure, a pixel layer of the display panel includes a plurality of first sub-pixels arranged in a first arrangement in the first display region and a plurality of second sub-pixels arranged in a second arrangement in the second display region, and the second arrangement of the second sub-pixel is different from the first arrangement of the first sub-pixels. The second light-emitting structure of each of the second sub-pixels and the first light-emitting structure of each of the first sub-pixels respectively adjacent to the boundary and having a same color are interconnected to form an interconnected light-emitting structure, and each of the interconnected light-emitting structures may correspond to a vapor deposition opening of a mask, thereby realizing the simultaneous formation of the second light-emitting structure and the first light-emitting structure respectively adjacent to the boundary and having the same color, whereby a problem of mutual interference between the vapor deposition process of the second light-emitting structure and the vapor deposition process of the first light-emitting structure when the first light-emitting structure and the second light-emitting structure respectively correspond to different vapor deposition openings is solved. In addition, by forming the interconnected light-emitting structure, a too wide non-luminous region between the second sub-pixel and the first sub-pixel adjacent to the boundary is avoided, thereby reducing a size of a rib of a pixel opening and eliminating at least one dark line easily appearing at the boundary when the display panel of the display device are displaying.

BRIEF DESCRIPTION OF THE DRAWINGS

By reading the following detailed description of the non-limiting embodiments with reference to the accompanying drawings, other features, objections, and advantages of the present disclosure will become more apparent, wherein the same or similar reference signs indicate the same or similar features, and the drawings are not drawn to actual scale.

DETAILED DESCRIPTION

In a smart electronic apparatus such as a mobile phone and a tablet computer, it is necessary to integrate a photosensitive component such as a front camera, an infrared light sensor and a proximity light sensor at a side where a display panel is disposed. In some embodiments, a light-transmitting display region may be disposed in the above-mentioned electronic apparatus, and the photosensitive component may be disposed under the light-transmitting display region, thereby realizing a full-screen display of the electronic apparatus while the normal operation of the photosensitive component is ensured.

In the display panel having the light-transmitting display region, an arrangement of pixels of the light-transmitting display region is usually different from an arrangement of pixels of the light-proof display region, and in order to ensure that pixels of the light-transmitting display region and pixels of the light-proof display region respectively adjacent to a boundary satisfy the requirement of a vapor deposition process, a distance between pixel in the light-transmitting region and pixel in the light-proof region (non-luminous region) respectively adjacent to the boundary is often large, thereby resulting in a dark line appearing when the display panel is displaying, thus affecting the display effect.

In order to solve the above-mentioned problem, the embodiments of the present disclosure provide a display panel and a display device, and the embodiments of the display panel and the display device will be described below with reference to the accompanying drawings.

An embodiment of the present disclosure provides a display panel, which may be an organic light-emitting diode (OLED) display panel. Hereinafter, the display panel of embodiments of the present disclosure will be described in detail with reference to the accompanying drawings.

Figure 1:
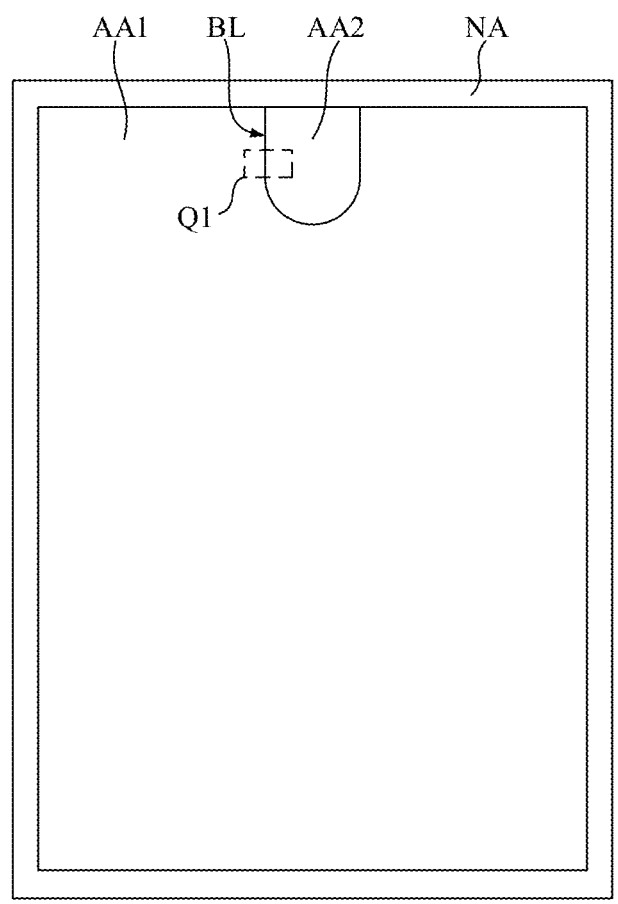
FIG. 1 is a schematic top view of a display panel provided according to an embodiment of the present disclosure.

FIG. 1 is a schematic top view of a display panel provided according to an embodiment of the present disclosure, the display panel 100 includes a first display region AA1, a second display region AA2 and a boundary BL located between the first display region AA1 and the second display region AA2, and optionally, the display panel 100 further includes a non-display region NA surrounding a periphery of the first display region AA1 and the second display region AA2.

Optionally, a light transmittance of the second display region AA2 is greater than a light transmittance of the first display region AA1. In this application, the light transmittance of the second display region AA2 is equal to or greater than 15%. In order to guarantee that the light transmittance of the second display region AA2 is greater than 15%, even greater than 40%, and even higher, in an embodiment, the light transmittance of at least some functional film layers of the display panel 100 in the second display region AA2 is greater than 80%, and even greater than 90%.

According to the display panel 100 of an embodiment of the present disclosure, the light transmittance of the second display region AA2 is greater than the light transmittance of the first display region AA1, so a photosensitive component may be integrated at the back of the second display region AA2, the photosensitive component such as the camera can be integrated under a screen, and images can be displayed on the second display region AA2, thereby increasing a display area of the display panel 100 and realizing a full-screen design of the display device.

Figure 2:
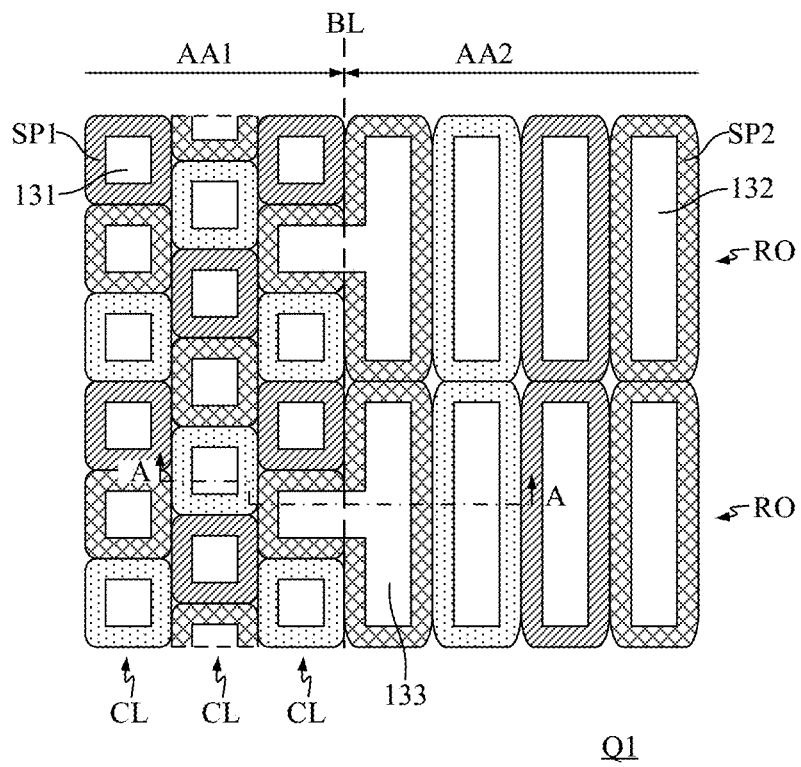
FIG. 2 is a partial enlarged view of an example of a region Q1 in FIG. 1.
Figure 3:
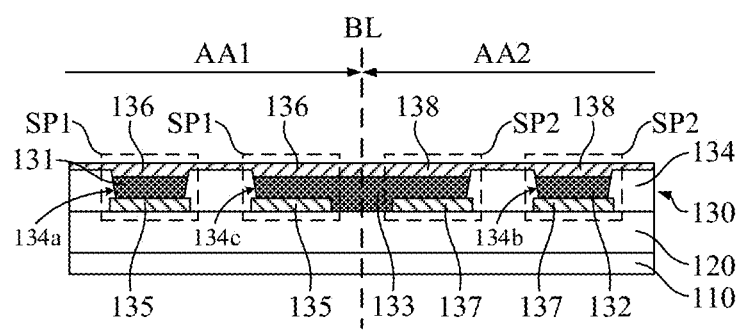
FIG. 3 is a cross-sectional view taken along a line A-A in FIG. 2.

FIG. 2 is a partial enlarged view of an example of a region Q1 in FIG. 1 and FIG. 3 is a cross-sectional view taken along a line A-A in FIG. 2. The display panel 100 includes a substrate 110 and a pixel layer 130 located on the substrate 110. Optionally, the display panel 100 further includes a component layer 120 which is located on the substrate 110, and the pixel layer 130 is located on the component layer 120.

The substrate 110 may be made of a light-transmitting material such as glass, polyimide (PI) or the like. The component layer 120 may include at least one pixel circuit for driving the sub-pixels to display, and the component layer 120 may be configured as a transparent layer structure. The pixel layer 130 includes a plurality of sub-pixels.

Optionally, the display panel 100 may further include an encapsulating layer, a polarizer and a cover plate. In an embodiment, the polarizer and the cover plate are located on the encapsulating layer. In an embodiment, the cover plate may be directly disposed on the encapsulating layer without the polarizer. In an embodiment, the cover plate may at least be directly disposed on the encapsulating layer of the second display region AA2 without the polarizer, thereby avoiding the effect of the polarizer on the light collecting amount of the corresponding photosensitive element disposed under the second display region AA2, and of course, the polarizer also can be disposed on the encapsulating layer of the second display region AA2.

The pixel layer 130 includes a plurality of first sub-pixels SP1 and a plurality of second sub-pixels SP2. The first sub-pixels SP1 are arranged in a first arrangement in the first display region AA1, and each of the first sub-pixels includes a first light-emitting structure 131. The second sub-pixels SP2 are arranged in a second arrangement in the second display region AA2, each of the second sub-pixels includes a second light-emitting structure 132. The second arrangement of the second sub-pixels is different from the first arrangement of the first sub-pixels SP1.

The first sub-pixels SP1 include a plurality of sub-pixels with different colors, the second sub-pixels SP2 include a plurality of sub-pixels with different colors. The first sub-pixels SP1 include, for example, a red first sub-pixel SP1, a green first sub-pixel SP1 and a blue first sub-pixel SP1 which are arranged in a predetermined rule in the first display region AA1 to form the first arrangement. The second sub-pixels SP2 may also include a red second sub-pixel SP2, a green second sub-pixel SP2 and a blue second sub-pixel SP2 which are arranged in a predetermined rule in the second display region AA2 to form the second arrangement.

Optionally, the second light-emitting structure 132 of each of the second sub-pixels SP2 and the first light-emitting structure 131 of each of the first sub-pixels SP1 respectively adjacent to the boundary BL and having a same color are interconnected to form an interconnected light-emitting structure 133.

According to the display panel 100 of an embodiment of the present disclosure, each interconnected light-emitting structure 133 may correspond to a vapor deposition opening of a mask, thereby realizing the simultaneous formation of the second light-emitting structure 132 and the first light-emitting structure respectively adjacent to the boundary BL and having the same color, whereby the problem of mutual interference between the vapor deposition process of the second light-emitting structure 132 and the vapor deposition process of the first light-emitting structure 131 when the first light-emitting structure and the second light-emitting structure respectively correspond to different vapor deposition openings is solved. In addition, by forming the interconnected light-emitting structure 133, a too wide non-luminous region between the second sub-pixel SP2 and the first sub-pixel SP1 which are adjacent to the boundary BL is avoided, thereby reducing a size of a rib of a pixel opening and eliminating at least one dark line easily appearing at the boundary BL when the display panel 100 is displaying.

In an embodiment of the present disclosure, the second arrangement of the second sub-pixels SP2 is different from the first arrangement of the first sub-pixels SP1. Optionally, a density of the second sub-pixels of the second display region AA2 is lower than a density of the first sub-pixels of the first display region AA1, and a size of the second light-emitting structure 132 of the second sub-pixel SP2 is larger than a size of the first light-emitting structure 131 of the first sub-pixel SP1 having a same color with the second light-emitting structure 132 of the second sub-pixel.

Herein, a size of a certain component refers to a size of the area of the display surface of the display panel occupied by the whole structure included (or designed) in the certain component.

As shown in FIG. 2, optionally, the first arrangement of the first sub-pixels SP1 includes a plurality of sub-pixel columns CL, each of the sub-pixel columns CL includes a plurality of first sub-pixel groups repeatedly arranged in sequence, each of the first sub-pixel groups includes a plurality of first sub-pixels with different colors, and any two first sub-pixels disposed in any two adjacent sub-pixel columns are not aligned.

Optionally, the second arrangement of the second sub-pixels SP2 includes a plurality of sub-pixel rows RO, each of the sub-pixel rows RO includes a plurality of second sub-pixel groups repeatedly arranged in sequence, and each of the second sub-pixel groups includes a plurality of second sub-pixels with different colors. Optionally, a direction in which the sub-pixel row RO extends is perpendicular to a direction in which the sub-pixel column CL extends.

As shown in FIG. 3, optionally, the pixel layer 130 further includes a pixel-defining layer 134, the pixel-defining layer includes a plurality of first pixel openings 134a, a plurality of second pixel openings 134b and a plurality of third pixel openings 134c. The first pixel openings 134a are located in the first display region AA1 and configured to respectively receive the plurality of first light-emitting structures 131 of the first sub-pixels SP1. The second pixel openings 134b are located in the second display region AA2 and configured to respectively receive the plurality of second light-emitting structures 132 of the second sub-pixels SP2. A portion of each of the third pixel openings 134c is located in the first display region AA1, the other portion of each of the third pixel openings is located in the second display region AA2, and the third pixel openings 134c are configured to respectively receive the interconnected light-emitting structures 133.

Optionally, the third pixel opening 134c is a T-shaped opening. As shown in FIG. 2, optionally, the orthographic projection of the interconnected light-emitting structure 133 on the substrate 110 is shaped as a T. Optionally, the third pixel opening 134c may not be limited to the above-mentioned shape, and also the orthographic projection of the interconnected light-emitting structure 133 on the substrate 110 is not limited to the above-mentioned shape.

Figure 4:
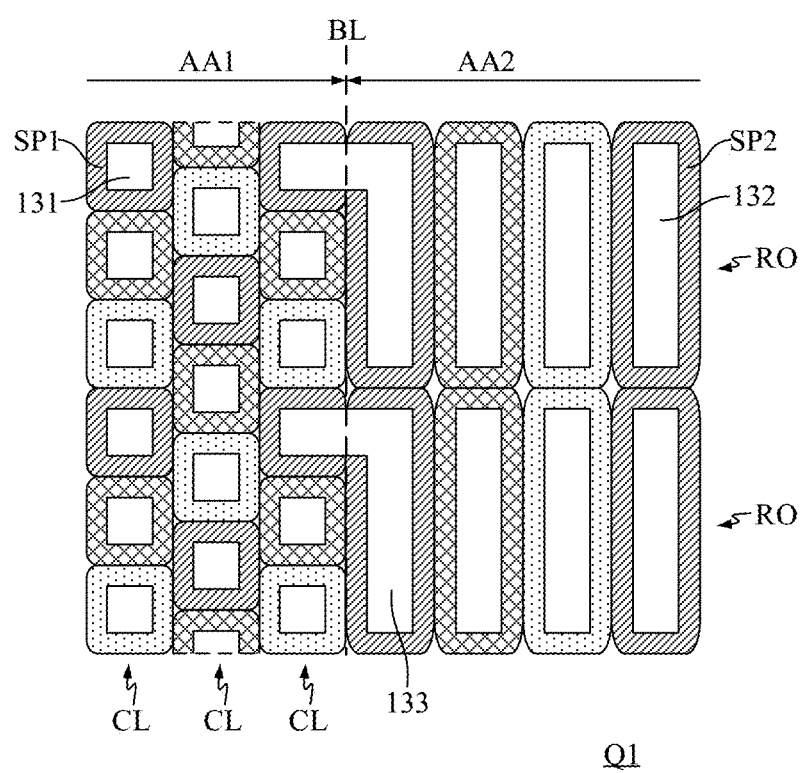
FIG. 4 is a partial enlarged view of another example of a region Q1 in FIG. 1.

FIG. 4 is a partial enlarged view of another example of the region Q1 in FIG. 1, and in the display panel 100 of the other example, the orthographic projection of the interconnected light-emitting structure 133 on the substrate 110 is shaped as an L. Correspondingly, the third pixel opening 134c may be an L-shaped opening.

By shaping the interconnected light-emitting structure 133 as T or L, a width of some of the light-emitting structures of the display panel 100 at the boundary BL varies appropriately while at least one dark line easily appearing at the boundary BL when the display panel 100 is displaying is eliminated, thereby reducing the diffraction phenomenon at the boundary BL when the display panel is displaying and improving the display effect of the display panel 100.

With continue reference to FIGS. 1 to 3, optionally, each of the first sub-pixel SP1 further includes a first electrode 135 which is connected to a side of the first light-emitting structure 131 facing the substrate 110 and a second electrode 136 which is connected to a side of the first light-emitting structure 131 facing away from the substrate 110. One of the first electrode 135 and the second electrode 136 is a positive electrode, and the other is a negative electrode.

Each of the second sub-pixels SP2 further includes a third electrode 137 which is connected to a side of the second light-emitting structure 132 facing the substrate 110 and a fourth electrode 138 which is connected to a side of the second light-emitting structure 132 facing away from the substrate 110. One of the third electrode 137 and the fourth electrode 138 is a positive electrode, and the other is a negative electrode.

In this embodiment, the first electrode 135 and the third electrode 137 are positive electrodes, and the second electrode 136 and the fourth electrode 138 are negative electrodes. Optionally, a plurality of second electrodes 136 and a plurality of fourth electrodes 138 are interconnected as a common electrode.

In this embodiment, there is an interval between the first electrode 135 and the third electrode 137 connected to a same interconnected light-emitting structure 133. At the third pixel opening 134c, the first electrode 135, a portion of the interconnected light-emitting structure 133 and the corresponding second electrode 136 form the first sub-pixel SP1; and the third electrode 137, a portion of the interconnected light-emitting structure 133 and the corresponding fourth electrode 138 form the second sub-pixel SP2.

Optionally, the first electrode 135 is a light-transmitting electrode and the third electrode 137 is a light-transmitting electrode, and the material of the first electrode 135 and the third electrode 137 is, for example, indium tin oxide (ITO) or indium zinc oxide.

Optionally, the first electrode 135 is a reflective electrode and the third electrode 137 is a reflective electrode, each of the first electrode 135 and the third electrode 137 includes a first light-transmitting conductive layer, a reflective layer on the first light-transmitting conductive layer and a second light-transmitting conductive layer on the reflective layer. The first light-transmitting conductive layer and the second light-transmitting conductive layer may be ITO, indium zinc oxide, or the like; and the reflective layer may be a metal layer, for example, the reflective layer is made of silver.

The second electrode 136 may be a magnesium-silver alloy layer and the fourth electrode 138 may be a magnesium-silver alloy layer.

Optionally, the display panel 100 further includes at least one first pixel circuit, and the at least one first pixel circuit is electrically connected to the first sub-pixels SP1 and configured to drive the first sub-pixels SP1 to display. The at least one first pixel circuit may be disposed in the component layer 120 and located in the first display region AA1.

Figure 5:
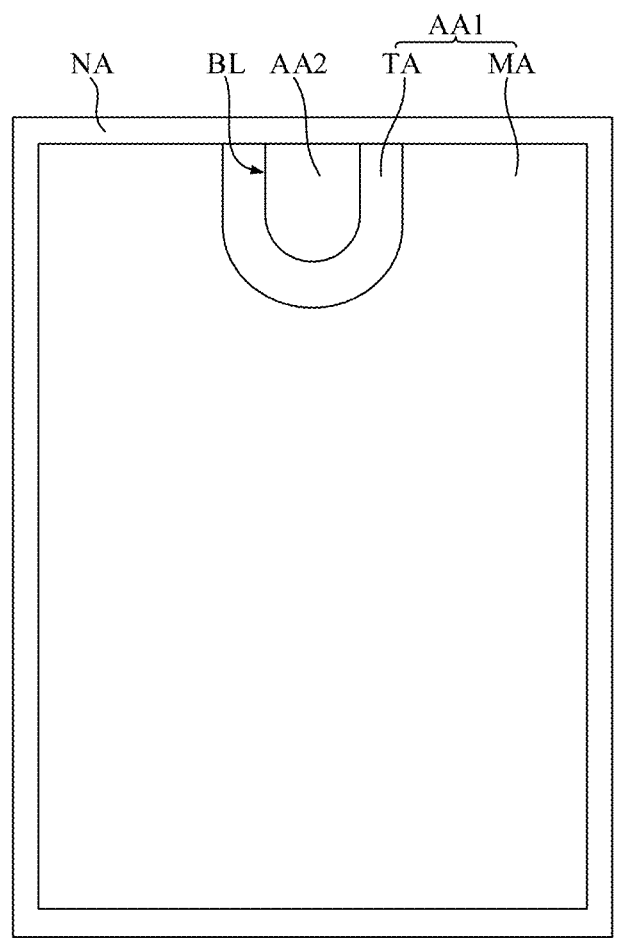
FIG. 5 is a schematic top view of a display panel provided according to another embodiment of the present disclosure.

FIG. 5 is a schematic top view of a display panel according to another embodiment of the present disclosure, the partial structure of the display panel 100 of this embodiment is the same as the display panel 100 of the previous embodiment, the difference between them will be described below, and the similarities will not be described in detail.

Unlike the foregoing embodiments, in the present embodiment, the first display region AA1 includes a main display region MA and a transition display region TA which is located between the main display region MA and the second display region AA2. The display panel 100 further includes at least one second pixel circuit, and the at least one second pixel circuit is electrically connected to the second sub-pixels SP2 and configured to drive the second sub-pixels SP2 to display. The second pixel circuit is disposed in the component layer 120 and located in the transition display region TA, thereby reducing wirings of the second display region AA2, thus increasing the light transmittance of the second display region AA2.

An embodiment of the present disclosure also provides a display device, the display device may include the display panel 100 of any one of the above-mentioned embodiments. The display device of an embodiment will be taken as an example for description as below, and in this embodiment, the display device includes the display panel 100 of one of the above-mentioned embodiments.

Figure 6:
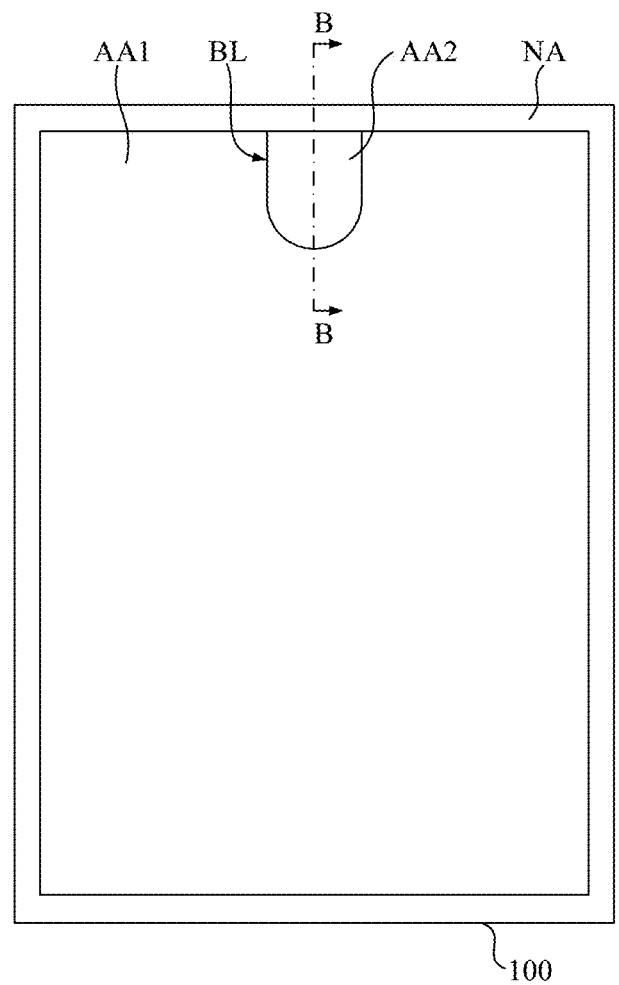
FIG. 6 is a schematic top view of a display device provided according to an embodiment of the present disclosure.
Figure 7:
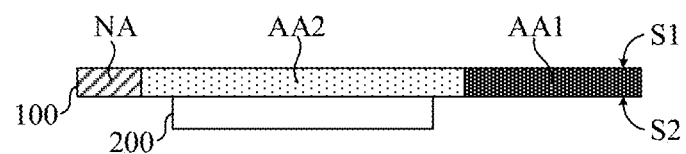
FIG. 7 is a cross-sectional view taken along a line B-B in FIG. 6.

FIG. 6 is a schematic top view of a display device provided according to an embodiment of the present disclosure and FIG. 7 is a cross-sectional view taken along a line B-B in FIG. 6. In the display device of the present embodiment, the display panel 100 may be the display panel 100 of one of the above-mentioned embodiments, and the display panel 100 includes a first display region AA1 and a second display region AA2 in a plane parallel to the substrate, and the light transmittance of the second display region AA2 is greater than the light transmittance of the first display region AA1.

The display panel 100 includes a first surface S1 and a second surface S2 opposite to each other, wherein the first surface S1 is a display surface. The display device further includes at least one photosensitive component 200 located at a side S2 of the display panel 100 where the second surface S2 is located, and the at least one photosensitive component 200 corresponds to the second display region AA2.

The at least one photosensitive component 200 may be an image capturing device for capturing external image information. In the present embodiment, the photosensitive component 200 is a Complementary Metal Oxide Semiconductor (CMOS) as the image capturing device, and optionally, the photosensitive component 200 may also be a Charge-coupled Device (CCD) or other form as the image capturing device. It can be understood that the photosensitive component 200 may not be limited to the image capturing device and also may be, for example, a light sensor such as an infrared sensor or a proximity sensor.

According to the display device of an embodiment of the present disclosure, the light transmittance of the second display region AA2 is greater than the light transmittance of the first display region AA1, so the photosensitive component 200 may be integrated at the back of the second display region AA2 of the display panel 100, it can be realized that the photosensitive component 200 such as the capturing device is integrated under a screen, and images can be displayed on the second display region AA2, thereby increasing a display area of the display panel 100 and realizing a full-screen design of the display device.

The pixel layer 130 of the display panel 100 includes a plurality of first sub-pixels SP1 arranged in a first arrangement in the first display region AA1 and a plurality of second sub-pixels SP1 arranged in a second arrangement in the second display region AA2, and the second arrangement of the second sub-pixels SP2 is different from the first arrangement of the first sub-pixels SP1. The second light-emitting structure 132 of each of the second sub-pixels SP2 and the first light-emitting structure 131 of each of the first sub-pixels SP1 respectively adjacent to the boundary BL and having a same color are interconnected to form an interconnected structure, and each interconnected light-emitting structure 133 may correspond to a vapor deposition opening of a mask, thereby realizing simultaneous formation of the second light-emitting structure 132 and the first light-emitting structure respectively adjacent to the boundary BL and having the same color, whereby the problem of mutual interference between the vapor deposition process of the second light-emitting structure 132 and the vapor deposition process of the first light-emitting structure 131 when the first light-emitting structure and the second light-emitting structure respectively correspond to different vapor deposition openings is solved. In addition, by forming the interconnected light-emitting structure 133, a too wide non-luminous region between the second sub-pixel SP2 and the first sub-pixel SP1 which are adjacent to the boundary BL is avoided, thereby reducing a size of a rib of a pixel opening and eliminating at least one dark line easily appearing at the boundary BL when the display panel 100 is displaying.

What is claimed is:

1. A display panel comprising a first display region, a second display region and a boundary between the first display region and the second display region, a light transmittance of the second display region being greater than a light transmittance of the first display region, and the display panel comprising:
    a substrate; and
    a pixel layer located on the substrate,
    wherein the pixel layer comprises:
        a plurality of first sub-pixels arranged in a first arrangement in the first display region, and each of the first sub-pixels comprising a first light-emitting structure; and
        a plurality of second sub-pixels arranged in a second arrangement in the second display region, and each of the second sub-pixels comprising a second light-emitting structure, and the second arrangement of the second sub-pixels being different from the first arrangement of the first sub-pixels, and
        the second light-emitting structure of each of the second sub-pixels and the first light-emitting structure of each of the first sub-pixels respectively adjacent to the boundary and having a same color are interconnected to form an interconnected light-emitting structure.

2. The display panel of claim 1, wherein the pixel layer further comprises a pixel-defining layer, the pixel-defining layer comprising:
   a plurality of first pixel openings located in the first display region and configured to respectively receive a plurality of first light-emitting structures of the first sub-pixels;
   a plurality of second pixel openings located in the second display region and configured to respectively receive a plurality of second light-emitting structures of the second sub-pixels; and
   a plurality of third pixel openings configured to respectively receive a plurality of interconnected light-emitting structures of the first sub-pixels and the second sub-pixels; a portion of each of the third pixel openings being located in the first display region, the other portion of each of the third pixel openings being located in the second display region.

3. The display panel of claim 2, wherein the third pixel opening is a T-shaped opening.

4. The display panel of claim 2, wherein the third pixel opening is an L-shaped opening.

5. The display panel of claim 1, wherein an orthographic projection of the interconnected light-emitting structure on the substrate is shaped as a T.

6. The display panel of claim 1, wherein an orthographic projection of the interconnected light-emitting structure on the substrate is shaped as an L.

7. The display panel of claim 1, wherein a density of the second sub-pixels in the second display region is lower than a density of the first sub-pixels in the first display region, and a size of the second light-emitting structure of the second sub-pixel is larger than a size of the first light-emitting structure of the first sub-pixel having a same color with the second light-emitting structure of the second sub-pixel.

8. The display panel of claim 1, wherein each of the first sub-pixels further comprises a first electrode which is connected to a side of the first light-emitting structure facing the substrate and a second electrode which is connected to a side of the first light-emitting structure facing away from the substrate; and
   each of the second sub-pixels further comprises a third electrode which is connected to a side of the second light-emitting structure facing the substrate and a fourth electrode which is connected to a side of the second light-emitting structure facing away from the substrate, wherein there is an interval between the first electrode and the third electrode which are connected to a same interconnected light-emitting structure.

9. The display panel of claim 8, wherein the first electrode is a light-transmitting electrode and the third electrode is a light-transmitting electrode.

10. The display panel of claim 8, wherein the first electrode is a reflective electrode and the third electrode is a reflective electrode.

11. The display panel of claim 8, wherein the second electrode is a magnesium-silver alloy layer and the fourth electrode is a magnesium-silver alloy layer.

12. The display panel of claim 1, wherein the first arrangement of the first sub-pixels comprises a plurality of sub-pixel columns, and each of the sub-pixel columns comprises a plurality of first sub-pixel groups repeatedly arranged in sequence, and each of the first sub-pixel groups comprises a plurality of first sub-pixels with different colors, any two first sub-pixels disposed in any two adjacent sub-pixel columns are not aligned.

13. The display panel of claim 12, wherein the second arrangement of the second sub-pixels comprises a plurality of sub-pixel rows, and each of the sub-pixel rows comprises a plurality of second sub-pixel groups repeatedly arranged in sequence, and each of the second sub-pixel groups comprises a plurality of second sub-pixels with different colors; and
   a direction in which the sub-pixel row extends is perpendicular to a direction in which the sub-pixel column extends.

14. The display panel of claim 1, wherein the first display region comprises a main display region and a transition display region which is located between the main display region and the second display region, and the display panel further comprises:
   at least one second pixel circuit located in the transition display region, the at least one second pixel circuit being electrically connected to the second sub-pixels and being configured to drive the second sub-pixels to display.

15. The display panel of claim 1, wherein the light transmittance of the second display region is equal to or greater than 15%.

16. A display device comprising the display panel according to claim 1.

17. The display device of claim 16, wherein the display panel comprises a first surface and a second surface opposite to each other, the first surface is a display surface, and the display device further comprises:
   at least one photosensitive component located at a side of the display panel where the second surface is located, and the at least one photosensitive component being corresponding to the second display region.

* * * * *